(12) United States Patent
Seong

(10) Patent No.: US 9,190,366 B2
(45) Date of Patent: *Nov. 17, 2015

(54) MULTI-CHIP PACKAGE

(71) Applicant: SK Hynix Inc., Icheon (KR)

(72) Inventor: Jin Yong Seong, Seoul (KR)

(73) Assignee: SK HYNIX INC., Icheon (KR)

( * ) Notice: Subject to any disclaimer, the term of this patent is extended or adjusted under 35 U.S.C. 154(b) by 293 days.

This patent is subject to a terminal disclaimer.

(21) Appl. No.: 13/727,008

(22) Filed: Dec. 26, 2012

(65) Prior Publication Data

US 2013/0162340 A1 Jun. 27, 2013

(30) Foreign Application Priority Data

Dec. 27, 2011 (KR) .......................... 10-2011-0143935

(51) Int. Cl.
*H01L 23/02* (2006.01)
*H01L 23/52* (2006.01)
*H01L 23/60* (2006.01)
*H01L 23/00* (2006.01)

(52) U.S. Cl.
CPC ................ *H01L 23/60* (2013.01); *H01L 24/06* (2013.01); *H01L 2224/48091* (2013.01); *H01L 2224/48247* (2013.01)

(58) Field of Classification Search
CPC .................... H01L 23/60; H01L 24/06; H01L 2224/48091; H01L 2224/48247
USPC .................................................. 257/686, 691
See application file for complete search history.

(56) References Cited

U.S. PATENT DOCUMENTS 8,350,374 B2 * 1/2013 Seong ........................ 257/686

* cited by examiner

*Primary Examiner* — Luan C Thai

(57) ABSTRACT

A multi-chip package includes a single lead and a plurality of inner package chips. Each of the plurality of inner package chips includes at least one pad circuit and an internal circuit. The pad circuit is selectively coupled to the lead and configured to provide a chip address signal corresponding to a connection state to the lead. The inner package chip receives the chip address signal to identify a corresponding inner package chip.

17 Claims, 8 Drawing Sheets

MULTI-CHIP PACKAGE

CROSS-REFERENCE TO RELATED APPLICATION

The priority of Korean patent application No. 10-2011-0143935 filed on Dec. 27, 2011, the disclosure of which is hereby incorporated in its entirety by reference, is claimed.

BACKGROUND OF THE INVENTION

Embodiments of the present invention relate to a multi-chip package, and more particularly to a multi-chip package including a plurality of inner package chips each of which includes a pad circuit capable of stably providing internal circuits with a voltage received from an external lead.

A multi-chip packaging technology has been proposed to package many chips in a single package as electronic devices become super-miniaturized. A multi-chip package is more preferable in terms of weight and size than a single-chip package.

In order to drive a plurality of different chips in the multi-chip package, different addresses are assigned to individual chips such that each chip can be operated selectively. For example, assuming that the multi-chip package includes four chips, a first address '00' may be assigned to a first chip, a second address '01' may be assigned to a second chip, a third address '10' may be assigned to a third chip, and a fourth address '11' may be assigned to a fourth chip in such a manner that a desired chip from among the four chips can be selected.

BRIEF SUMMARY OF THE INVENTION

Various embodiments of the present invention are directed to providing a multi-chip package that substantially obviates one or more problems due to limitations and disadvantages of the related art.

An embodiment of the present invention relates to a technology for reducing the size of a multi-chip package by reducing the number of pads used to select a plurality of chips in the multi-chip package.

An embodiment of the present invention relates to a multi-chip package for providing a chip address signal capable of identifying each chip in the multi-chip package using one lead, such that there is no limitation on positioning a plurality of chips in association with a lead mounted on a package substrate.

An embodiment of the present invention relates to a technology for changing operation setting information of a plurality of chips when the plurality of chips are wired in a multi-chip package, such that it is possible to select an operation of each chip using a physical method, resulting in accomplishing a stable operation.

In accordance with one embodiment of the present invention, a multi-chip package includes a single lead and a plurality of inner package chips. Each of the plurality of inner package chips includes at least one pad circuit selectively coupled to the lead, and configured to provide a chip address signal corresponding to a connection state to the lead. An internal circuit included in the each of the plurality of inner package chips receives the chip address signal to identify a corresponding inner package chip.

The pad circuit may include at least one pad selectively coupled to the lead to receive an external power-supply voltage; and a control circuit electrically coupled to the pad and configured to stabilize a voltage of the pad to an addressing voltage so as to provide the chip address signal.

If the lead is coupled to the at least one pad, the control circuit may be configured to cause the addressing voltage to correspond to a first logic state. If the lead is not coupled to the at least one pad, the control circuit may be configured to maintain the addressing voltage so that is corresponds to a second logic state.

The first logic state may correspond to a logic state "HIGH", and the second logic state may correspond to a logic state "LOW".

The control circuit may include a logic element configured to perform a logic operation on a power on reset signal and a voltage of an address node selectively coupled to the lead; a PMOS transistor and a first NMOS transistor configured to operate in a complementary manner in response to a signal output from the logic element; and a second NMOS transistor including a gate terminal coupled to a first node between the PMOS transistor and the first NMOS transistor, and coupling the address node to a ground voltage terminal in response to a voltage of the first node.

The control circuit may further include an electrostatic discharge (ESD) circuit coupled to and disposed between the address node and the logic element and configured to prevent the voltage of the address node from suddenly increasing.

The PMOS transistor may include a first terminal receiving a power-supply voltage and a gate terminal coupled to an output terminal of the logic element; and the first NMOS transistor may include a first terminal coupled to the ground voltage terminal, a gate terminal coupled to the output terminal of the logic element, and a second terminal coupled to the first node.

The control circuit may further include a second NMOS transistor coupled to and disposed between a second terminal of the PMOS transistor and the first node and configured to compensate for a difference in driving ability between the PMOS transistor and the first NMOS transistor.

The multi-chip package may further include a buffer configured to provide the chip address signal upon receiving the addressing voltage.

The number of pad circuits included in each of the plurality of inner package chips may be two or more, and the chip address signal may include bits corresponding to the number of the pad circuits.

The lead may be formed at a predetermined position of a package substrate.

The package substrate may include a ball grid array (BGA), a small outline package (SOP), or a land grid array (LGA).

The lead may be electrically coupled to a pad circuit through wiring.

In accordance with another embodiment of the present invention, a multi-chip package includes a single lead and a plurality of inner package chips. Each of the plurality of inner package chips includes at least one pad circuit selectively coupled to the lead and configured to provide a chip option signal corresponding to a connection state to the lead; and an internal circuit configured to determine an operation mode based on the chip option signal.

The chip option signal may maintain a logic state "HIGH" or a logic state "LOW" according to the connection state to the lead.

The pad circuit may be coupled to the lead through a bonding wire.

The pad circuit may include at least one pad selectively coupled to the lead to receive an external power-supply voltage; and a control circuit electrically coupled to the pad and configured to stabilize a voltage of the pad and provide the stabilized voltage as a chip option signal.

It is to be understood that both the foregoing general description and the following detailed description of the present invention are exemplary and explanatory and are intended to provide further explanation of the invention as claimed.

DESCRIPTION OF EMBODIMENTS

Reference will now be made in detail to the embodiments of the present invention, examples of which are illustrated in the accompanying drawings. Wherever possible, the same reference numbers will be used throughout the drawings to refer to the same or like parts.

Figure 1A:
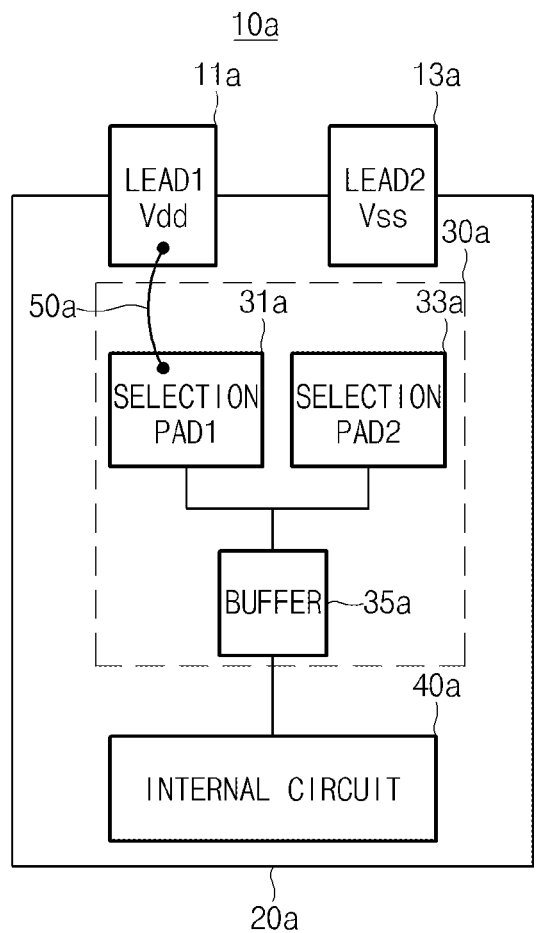
FIGS. 1A and 1B illustrate block diagrams of multi-chip packages according to an embodiment of the present invention.
Figure 1B:
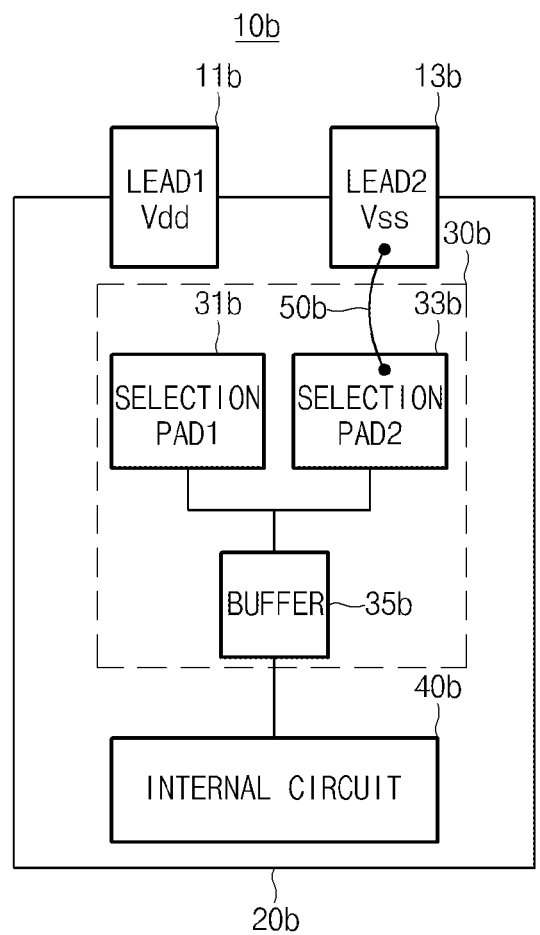

FIGS. 1A and 1B illustrate block diagrams of multi-chip packages according to an embodiment of the present invention. Although individual constituent elements of multi-chip packages 10a and 10b shown in FIGS. 1A and 1B are identical to each other, it should be noted that a connection relationship between a selection pad 31a and an external lead 11a through a wire 50a in FIG. 1A is different from a connection relationship between a selection pad 33b and an external lead 13b through a wire 50b in FIG. 1B. Since the above-mentioned connection relationships between the external lead and the selection pad are different from each other, a chip address signal provided to an internal circuit may be changed.

Referring to FIG. 1A, the multi-chip package 10a may include an inner package chip 20a. The inner package chip 20a may include the first lead 11a for receiving an external power-supply voltage Vdd, a second lead 13a for receiving an external ground voltage Vss, a pad circuit 30a coupled to the first and second leads 11a and 13a, and an internal circuit 40a coupled to the pad circuit 30a.

The inner package chip 20a may include various chip structures. For convenience of description and better understanding of the present invention, the pad circuit 30a configured to receive an external voltage or signal from an external device will hereinafter be described in detail.

The pad circuit 30a is electrically coupled to at least one of the first lead 11a and the second lead 13a through the wire 50a. As a result, the pad circuit 30a receives the power-supply voltage Vdd or the ground voltage Vss and provides the received voltages to the internal circuit 40a. A voltage transferred from the pad circuit 30a to the internal circuit 40a may correspond to a chip address signal.

In accordance with an embodiment, the pad circuit 30a may include the first selection pad 31a capable of being coupled to the first lead 11a to receive the power-supply voltage Vdd, a second selection pad 33a capable of being coupled to the second lead 13a to receive the ground voltage Vss, and a buffer 35a for providing a voltage received from the first selection pad 31a or the second selection pad 33a to the internal circuit 40a. In FIG. 1A, the power-supply voltage Vdd is provided to the first selection pad 31a through the wire 50a, and the first selection pad 31a provides the power-supply voltage Vdd to the internal circuit 40a through the buffer 35a.

The internal circuit 40a may perform a variety of functions to operate the inner package chip 20a. The internal circuit 40a may be identified on the basis of a chip address signal received from the pad circuit 30a. That is, the internal package chip 20a coupled to the first and second leads 11a and 13a can be identified by a chip address signal corresponding to the power-supply voltage Vdd.

Referring to FIG. 1B, the second lead 13b for providing the ground voltage Vss is electrically coupled to the second selection pad 33b through the wire 50b. Thus, the ground voltage Vss is transferred to an internal circuit 40b through the second lead 13b, the selection pad 33b, and a buffer 35b. That is, an inner package chip 20b, coupled to leads 11b and 13b shown in FIG. 1B, can be identified by a chip address signal corresponding to the external ground voltage Vss.

In accordance with this embodiment, the inner package chip 20a shown in FIG. 1A includes two selection pads 31a and 33a, and the inner package chip 20b shown in FIG. 1B includes two selection pads 31b and 33b. The positions of the selection pads 31a, 33a, 31b, and 33b may be limited to within a predetermined range in association with the positions of the first leads 11a and 11b and the second leads 13a and 13b. Since the first leads 11a and 11b and the second leads 13a and 13b are fixed at predetermined positions of a package substrate onto which the inner package chips 20a and 20b are packaged, the inner package chips 20a and 20b cannot be spaced apart from the leads 11a, 11b, 13a, and 13b by a predetermined distance or more. If spacing between each inner package chip and each lead increases, it may be difficult to implement wiring between the inner package chip and the lead. The package substrate may include a ball grid array (BGA), a small outline package (SOP), or a land grid array (LGA).

Figure 2A:
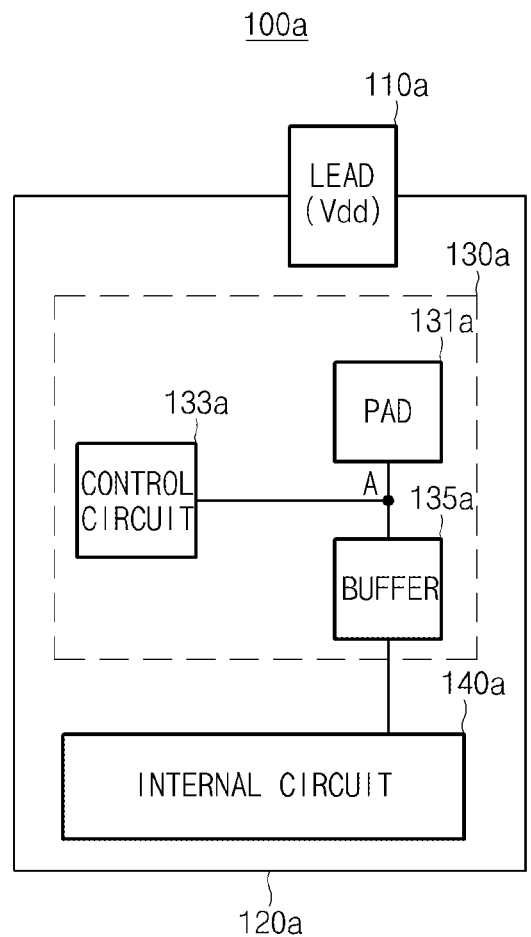
FIGS. 2A and 2B illustrate block diagrams of multi-chip packages according to another embodiment of the present invention.
Figure 2B:
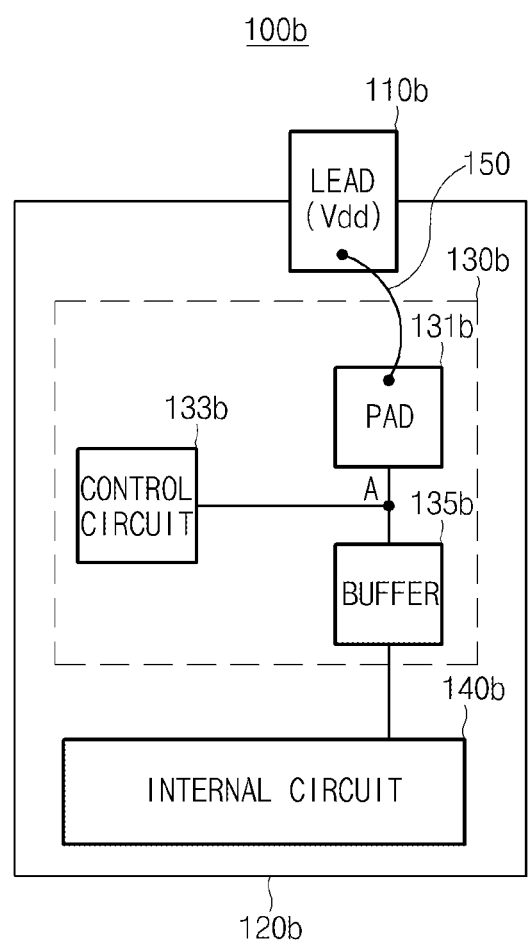

FIGS. 2A and 2B illustrate block diagrams of multi-chip packages according to another embodiment of the present invention.

Although a multi-chip package 100a shown in FIG. 2A and a multi-chip package 100b shown in FIG. 2B are different in terms of the presence or absence of a wire 150 for coupling a lead 110a or 110b to a pad 131a or 131b, the remaining constituent elements other than the wire 150 are identical in FIGS. 2A and 2B.

The multi-chip package 100a or 100b may include an inner package chip 120a or 120b and the lead 110a or 110b coupled to the inner package chip 120a or 120b. The multi-chip package 100a or 100b may include one external lead 110a or 100b and one pad 131a or 131b. The number of leads and the number of pads contained in the multi-chip package 100a or 100b shown in FIG. 2A or 2B are reduced as compared to those of the multi-chip packages 10a and 10b shown in FIGS. 1A and 1B, such that the area occupied by the multi-chip package shown in FIG. 2A or 2B is smaller than that of the multi-chip packages shown in FIGS. 1A and 1B. If a lead for receiving a voltage or a signal from an external device is fixed at a specific position, while the inner package chip shown in FIG. 1A or 1B is located close to two leads that provide the powers-supply voltage Vdd and the ground voltage Vss, then the inner package chip shown in FIG. 2A or 2B is located close to only one lead 110a or 110b. Therefore, the multi-chip packages shown in FIGS. 2A and 2B can achieve design extensibility.

Referring to FIGS. 2A and 2B, a pad circuit 130a includes a control circuit 133a, the pad 131a, and a buffer 135a. A pad circuit 130b includes a control circuit 133b, the pad 131b, and a buffer 135b. The buffer 135a or 135b may provide a chip address signal to an internal circuit 140a or 140b.

The control circuit 133a (or 133b) may stably maintain a voltage of an address node (A) between the pad 131a (or 13b) and the buffer 135a (or 135b). For example, the control circuit 133a (or 133b) can stably maintain the voltage of the address node (A) at the power-supply voltage Vdd or the ground voltage Vss. For example, if the pad 131a (or 131b) is coupled to the lead 110a (or 110b) to receive the power-supply voltage Vdd, the control circuit 133a (or 133b) maintains the voltage of the address node A at the power-supply voltage Vdd. On the other hand, if the pad 131a (or 131b) is not coupled to the lead 110a (or 110b) and does not receive the power-supply voltage Vdd, the control circuit 133a (or 133b) maintains the voltage of the address node A at the ground voltage Vss. Operations of the control circuits 133a and 133b will be described later with reference to FIGS. 3A and 3B.

Referring to FIG. 2A, the external lead 110a is not coupled to the pad 131a. As a result, the voltage of the address node A applied to the buffer 135a may be unexpectedly in a floating state. In accordance with an embodiment, the control circuit 133a controls the voltage of the address node A so that it is maintained at the ground voltage Vss under the condition that a voltage from an external part is not applied to the pad 131a. Thus, a chip address signal corresponding to the ground voltage Vss may be provided to the internal circuit 140a. As a result, the multi-chip package shown in FIG. 2A need not use the ground voltage Vss supplied from the lead.

In another embodiment, as shown in the multi-chip package 100b shown in FIG. 2B, the external lead 110b and the pad 131b are electrically coupled to each other through the wire 150. Accordingly, the external power-supply voltage Vdd is applied to the address node A through the pad 131b and the wire 150, and the control circuit 133b can stably maintain the voltage of the address node A at a voltage level corresponding to the power-supply voltage Vdd. As a result, a chip address signal corresponding to the power-supply voltage Vdd is applied to the internal circuit 140b through the buffer 135b.

Therefore, the inner package chip 120a shown in FIG. 2A is identified by a chip address signal corresponding to the ground voltage Vss, and the inner package chip 120b shown in FIG. 2B is identified by a chip address signal corresponding to the power-supply voltage Vdd. In other words, the inner package chip 120a shown in FIG. 2A may be identified by a chip address signal corresponding to a logic state "LOW", and the inner package chip 120b shown in FIG. 2B may be identified by a chip address signal corresponding to a logic state "HIGH".

As described above, since the multi-chip package shown in FIG. 2A or 2B includes the control circuit 133a or 133b, which stably controls a voltage level of the address node A, the inner package chips 120a and 120b can be identified using one lead 110a or 110b for providing the power-supply voltage Vdd.

Figure 3:
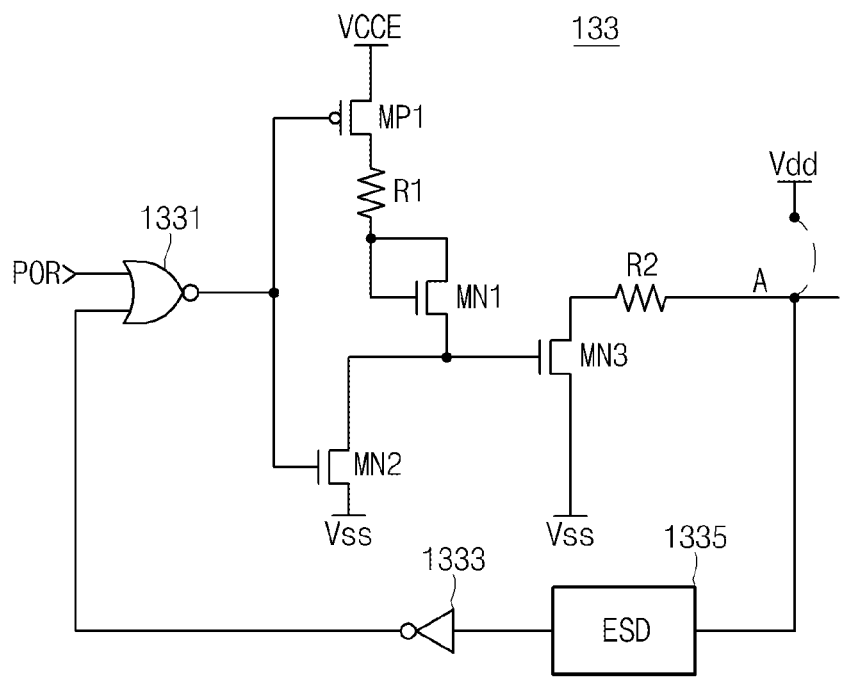
FIG. 3 illustrates a circuit diagram of a control circuit according to an embodiment of the present invention.

FIG. 3 illustrates a circuit diagram of a control circuit according to an embodiment of the present invention. Referring to FIG. 3, a dotted line disposed between a terminal of a power-supply voltage Vdd and an address node A is used to explain not only an embodiment in which the lead for providing the power-supply voltage Vdd is coupled to the pad circuit 130a or 130b, but also another embodiment in which the lead for providing the power-supply voltage Vdd is not coupled to the pad circuit 130a or 130b.

Referring back to FIG. 3, the control circuit 133 includes a PMOS transistor MP1, first to third NMOS transistors MN1, MN2, and MN3, first and second resistors R1 and R2, first and second logic elements 1331 and 1333 and an electrostatic discharge (ESD) circuit 1335.

The first logic element 1331 performs a logical operation on a power on reset signal POR and an address node signal /A corresponding to an inverted value of a voltage of the address node A, and provides the logical operation result to a gate terminal of the PMOS transistor MP1 and a gate terminal of the second NMOS transistor MN2. The first logic element 1331 may include a logic AND operation configured to perform an NOR operation as necessary.

The PMOS transistor MP1 includes a first terminal for receiving an external voltage VCCE, a second terminal coupled to the first resistor R1, and the gate terminal coupled to an output terminal of the first logic element 1331. The first resistor R1 is coupled to and disposed between the second terminal of the PMOS transistor MP1 and a gate terminal and a second terminal of the first NMOS transistor MN1. The first NMOS transistor MN1 is implemented as a diode-connected transistor in which a second terminal and a gate terminal are connected to each other to pass a current to a first terminal.

The first terminal of the first NMOS transistor MN1 is coupled to a second terminal of the second NMOS transistor MN2. The second NMOS transistor MN2 includes the second terminal coupled to the first terminal of the first NMOS transistor MN1, the gate terminal coupled to the output terminal of the first logic element 1331, and a first terminal coupled to a terminal for providing a ground voltage Vss.

The third NMOS transistor MN3 includes a second terminal coupled to one terminal of the second resistor R2, a gate terminal coupled to the first terminal of the first NMOS transistor MN1, and a first terminal coupled to the ground voltage terminal. The other terminal of the second resistor R2 is coupled to the address node A.

As can be seen from FIG. 2A, the pad circuit 130a is not coupled to the external lead 110a, such that the address node A does not receive the power-supply voltage Vdd. In this case, the voltage of the address node A is in a floating state, such that a leakage current may occur.

However, as shown in FIG. 3, in the control circuit 133, the ESD circuit 1335 is coupled to the address node A and the second logic element 1333, and the address node signal /A from the address node A is fed back to the first logic element 1331.

Therefore, the ESD circuit 1335 can prevent the internal circuit 140a of the inner package chip 120a from being damaged when the voltage of the address node A suddenly increases. The second logic element 1333 may include an inverter for inverting the voltage of the address node A to output the address node signal /A to the first logic element 1331.

Figure 4A:
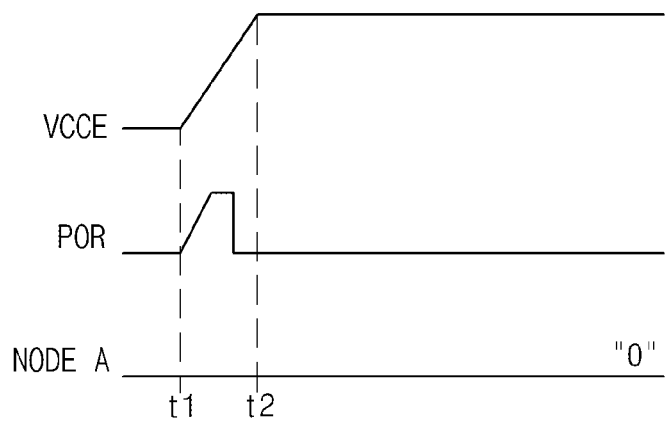
FIGS. 4A and 4B are waveform diagrams illustrating an operation of the control circuit shown in FIG. 3.

FIG. 4A is a waveform diagram illustrating an operation of the control circuit 133 shown in FIG. 3. An operation of the multi-chip package 100a shown in FIG. 2A will hereinafter be described with reference to FIGS. 3 and 4A.

The power on reset signal POR starts increasing to a predetermined voltage level for initialization at a time point t1, and the external voltage VCCE also starts increasing to a preset voltage level. In accordance with an embodiment of the present invention, the preset voltage level of the external voltage VCCE may be higher than the predetermined voltage level of the power on reset signal POR.

If the power on reset signal POR corresponds to a logic state "HIGH" at the time point t1, the first logic element 1331 provides a voltage corresponding to a logic state "LOW" to the gate terminal of the PMOS transistor MP1 and to the gate terminal of the second NMOS transistor MN2, irrespective of the voltage of the address node A.

Therefore, the PMOS transistor MP1 is turned on, and the second NMOS transistor MN2 is turned off. The PMOS transistor MP1 provides the external voltage VCCE to the gate terminal of the third NMOS transistor MN3 through the first resistor R1 and the first NMOS transistor MN1.

The first NMOS transistor MN1 serves as a diode, as described above, and may also be used to compensate for a difference in driving ability between the second NMOS transistor MN2 and the PMOS transistor MP1.

If the external voltage VCCE is applied to the control circuit 133, the third NMOS transistor MN3 is turned on, and the ground voltage Vss is applied to the address node A. Therefore, the address node A can maintain the ground voltage Vss level. If the ground voltage level of the address node A is inverted by the second logic element 1333, the second logic element 1333 outputs the address node signal /A, corresponding to a logic state "HIGH", so that a voltage corresponding to a logic state "LOW" is maintained at the output terminal of the first logic element 1331.

In the multi-chip package 100a according to an embodiment of the present invention, although the external lead 110a is not electrically coupled to the pad circuit 130a, the voltage of the address node A is maintained at the ground voltage Vss level before arriving at a time point t2, and a chip address signal corresponding to a logic state "LOW" may be provided to the internal circuit 140a through the buffer 135a.

Figure 4B:
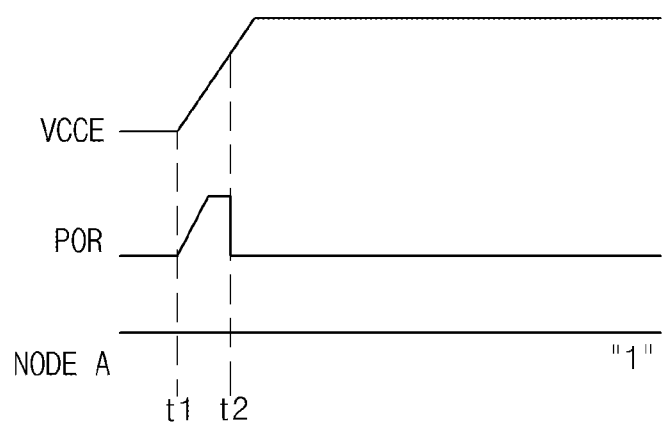

FIG. 4B is a waveform diagram illustrating an operation of the control circuit 133b contained in the multi-chip package 100b in which the external lead and the pad circuit shown in FIG. 2B are electrically coupled to each other. The operation of the control circuit 133b will be described with reference to FIGS. 2B, 3 and 4B.

Before the power on reset signal POR increases to a predetermined voltage level, i.e., at a time starting from an initial state generated before a time point t1, the external power-supply voltage Vdd is provided to the address node A through the external lead 110b, the wire 150, and the pad 131b, so that signals corresponding to a logic state "LOW" are applied to the first logic element 1331. Therefore, the first logic element 1331 outputs a voltage corresponding to a logic state "HIGH." The first PMOS transistor MP1 is turned off and the second NMOS transistor MN2 is turned on upon receiving the logic "HIGH" voltage from the first logic element 1331. If the second NMOS transistor MN2 is turned on, the ground voltage Vss is applied to the gate terminal of the third NMOS transistor MN3, and the third NMOS transistor MN3 is turned off to nullify or neutralize the control circuit 133b, so that the voltage of the address node A is maintained at the external power-supply voltage Vdd.

After that, although the power on reset signal POR increases, the power on reset signal POR increases to a predetermined level lower than that of the external voltage VCCE and then decreases to the ground voltage Vss level at a time point t2, such that the power on reset signal POR does not affect the voltage of the address node A.

Accordingly, a chip address signal corresponding to a logic state "HIGH" is provided to the internal circuit 140b through the buffer 135b.

As described above, the inner package chip 120a shown in FIG. 2A may be identified by a chip address signal corresponding to a logic value '0', and the inner package chip 120b shown in FIG. 2B may be identified by a chip address signal corresponding to a logic value '1'.

Figure 5:
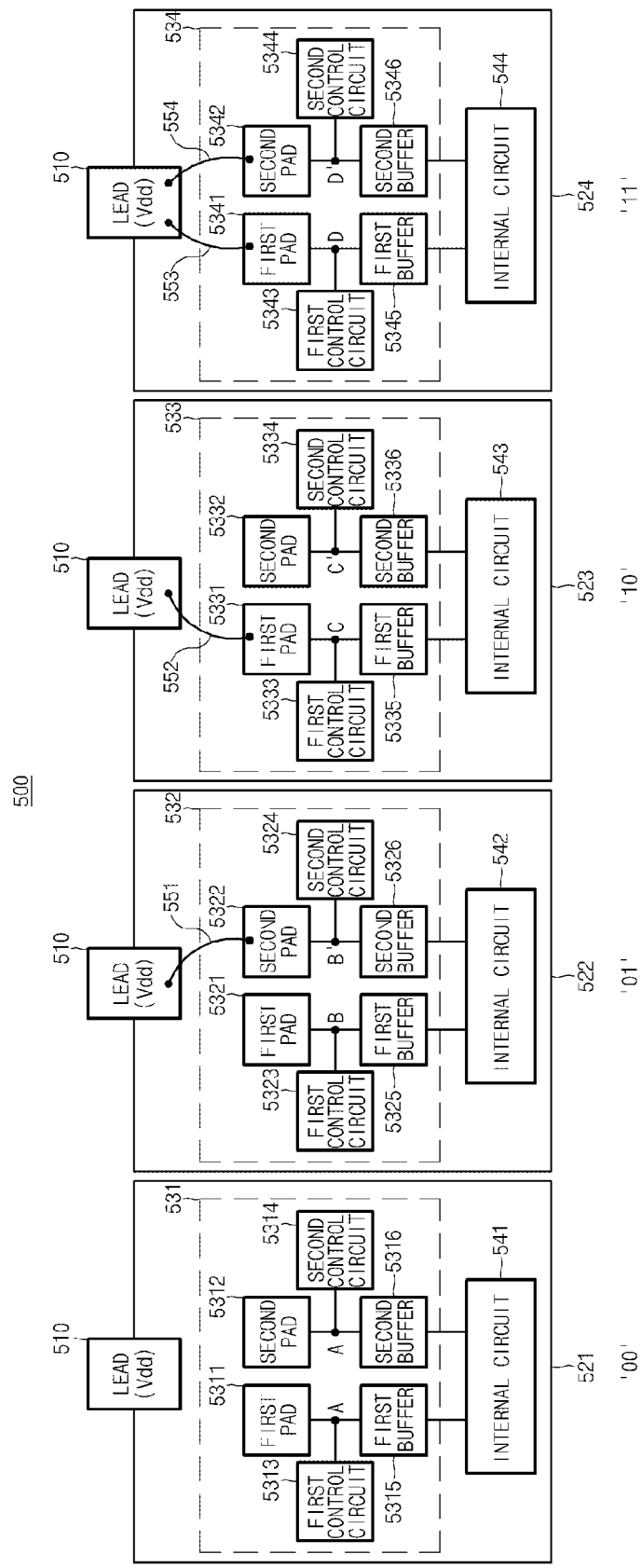
FIG. 5 illustrates a block diagram of a circuit structure for identifying each of four chips for use in a multi-chip package according to an embodiment of the present invention.

FIG. 5 illustrates a block diagram of a circuit structure for identifying each of four inner package chips for use in a multi-chip package according to an embodiment of the present invention.

Although FIG. 5 shows a plurality of inner package chips located on the same plane, it should be noted that a multi-chip package 500 may be formed by stacking a plurality of inner package chips on a single external lead 510.

In FIG. 5, a first inner package chip 521 may be identified by a chip address signal '00', a second inner package chip 522 may be identified by a chip address signal '01', a third inner package chip 523 may be identified by a chip address signal '10', and a fourth inner package chip 524 may be identified by a chip address signal '11'.

Compared to the multi-chip packages shown in FIGS. 2A and 2B, the multi-chip package shown in FIG. 5 may include two pads, two control circuits, and two buffers. Through the above-mentioned structure, a connection state between each pad and the external power-supply voltage Vdd is adjusted through wiring, such that the chip address signal of 2 bits can be generated. As the number of pads capable being coupled to the lead for providing a specific voltage is increased, the number of inner package chips identified by voltages of the pads may be increased by a predetermined number corresponding to $2^N$, N being the number of pads included in each inner package chip. Alternatively, in accordance with another embodiment of the present invention, the pad circuit can output a signal corresponding to a predetermined voltage level according to whether or not a specific voltage is provided thereto, so that each inner package chip can be identified using a chip enable signal or another signal, such as an input/output channel signal IO.

The inner package chips 521, 522, 523, and 524 may include pad circuits 531, 532, 533 and 534, and internal circuits 541, 542, 543 and 544, respectively. That is, the first inner package chip 521 includes the pad circuit 531 and the internal circuit 541, the second inner package chip 522 includes the pad circuit 532 and the internal circuit 542, the third inner package chip 523 includes the pad circuit 533 and the internal circuit 543, and the fourth inner package chip 524 includes the pad circuit 534 and the internal circuit 544. The pad circuits 531, 532, 533 and 534 may respectively include a first pad 5311, 5321, 5331 or 5341, a second pad 5312, 5322, 5332 or 5342, a first control circuit 5313, 5323, 5333 or 5343, a second control circuit 5314, 5324, 5334 or 5344, a first buffer 5315, 5325, 5335 or 5345, and a second buffer 5316, 5326, 5336 or 5346, respectively.

Each of the control circuits 5313, 5323, 5333, 5343, 5314, 5324, 5334 and 5344 shown in FIG. 5 is substantially the same as the control circuit shown in FIG. 3, and a voltage of each address node is maintained at a predetermined value according to a connection state to the external lead 510.

The first pad 5311 and the second pad 5312 in the first inner package chip 521 are not coupled to the external lead 510, so that nodes A and A' have the same ground voltage Vss level. As a result, a voltage corresponding to a logic state "LOW" is applied to the internal circuit 541 through the first buffer 5315 and the second buffer 5316. Thus the first inner package chip 521 can be identified by the chip address signal corresponding to '00'. In FIG. 5, the nodes A and A', nodes B and B', nodes C and C', and nodes D and D' may correspond to address nodes.

In the second inner package chip 522, although the first pad 5321 is not coupled to the external lead 510, the second pad 5322 is electrically coupled to the external lead 510 through a wire 551.

Therefore, since the node B corresponds to the ground voltage (Vss) level and the node B' corresponds to the power-supply voltage (Vdd) level, a chip address signal corresponding to a logic state "LOW" is received from the first buffer 5325 and a chip address signal corresponding to a logic state "HIGH" is received from the second buffer 5326. Thus, the second inner package chip 522 can be identified by the chip address signal corresponding to '01'.

In the third inner package chip 523, the first pad 5331 is electrically coupled to the external lead 510 through a wire 552, so that a voltage level of the node C corresponds to the power-supply voltage Vdd. The second pad 5332 is not coupled to the external lead 510, so that the node C' corresponds to the ground voltage (Vss) level.

Therefore, a chip address signal corresponding to a logic state "HIGH" is provided to the internal circuit 543 through the first buffer 5335, and a chip address signal corresponding to a logic state "LOW" is provided to the internal circuit 543 through the second buffer 5336, so that the third inner package chip 523 can be identified by a chip address signal corresponding to '10'.

The first or second pads 5341 and 5342 in the fourth inner package chip 524 are electrically coupled to the external lead 510 through wires 553 and 554, so that each of a voltage level measured at the node D and a voltage level measured at the node D' may correspond to the power-supply voltage (Vdd) level. Therefore, the fourth inner package chip 524 can be identified by a chip address signal corresponding to '11'.

As described above, the multi-chip package 500 can identify each of the inner package chips 521, 522, 523 and 524 using a connection relationship between each chip 521, 522, 523 or 524 and the single lead 510. As a result, the inner package chips can be more freely arranged, resulting in simplification of the wiring material and the wiring process.

Although the above-mentioned description has disclosed chip addressing depending upon the electrical connection between the external lead and the pad circuit, the chip addressing may also be carried out by further using a chip enable signal CE and an input/output (IO) signal as necessary.

A plurality of inner package chips can be identified from one another in various ways using the chip address signal or the chip enable signal. In Table 1, CS denotes a connection relationship between a lead and a pad circuit, CS_1 denotes a connection relationship between a lead and a first pad circuit, CS_2 denotes a connection relationship between a lead and a second pad circuit, and CS_3 denotes a connection relationship between a lead and a third pad circuit. NC denotes a non-connected state between a lead and a pad circuit, and Vdd denotes a connection state between a lead and a pad circuit. Each of CS_int_1 and CS_int_2 may denote a chip address signal transmitted from a lead to an internal circuit through a pad circuit. CS_int_1 denotes a first chip address signal received from the first pad circuit, and CS_int_2 denotes a second chip address signal received from the second pad circuit. CS_int_3 denotes a third address signal which is transmitted from a first chip enable signal lead for receiving a first chip enable signal to an inner chip through a pad circuit.

TABLE 1

| Chip | External | | | Internal | | |
|---|---|---|---|---|---|---|
| | CS_1 | CS_2 | CS_3 | CS_int_1 | CS_int_2 | CS_int_3 |
| Chip 1 | NC | NC | CE #1 | Vss | Vss | CE #1 |
| Chip 2 | Vdd | NC | CE #1 | Vdd | Vss | CE #1 |

TABLE 1-continued

| Chip | External | | | Internal | | |
|---|---|---|---|---|---|---|
| | CS_1 | CS_2 | CS_3 | CS_int_1 | CS_int_2 | CS_int_3 |
| Chip 3 | NC | Vdd | CE #1 | Vss | Vdd | CE #1 |
| Chip 4 | Vdd | Vdd | CE #1 | Vdd | Vdd | CE #1 |

As can be seen from Table 1, a pad circuit coupled to the external lead provides a chip address signal indicating a logic state "HIGH" corresponding to the power-supply voltage Vdd, and a pad circuit not coupled to the external lead provides a chip address signal indicating a logic state "LOW" corresponding to the ground voltage Vss. In Table 1, the first to fourth inner package chips receive the same chip enable signal CE #1, so that the inner package chips can be addressed only by the connection relationship between the external lead and the pad circuit. However, in accordance with an embodiment of the present invention, when the pad circuits perform chip addressing on the basis of the connection relationship between each pad circuit and the single lead for providing the power-supply voltage Vdd, the number of inner chips is limited. Therefore, in accordance with an embodiment, the chip enable signal CE is received through a separate pad circuit so as to identify each chip.

Compared to Table 1, Table 2 shows first to fourth chip enable signals CE #1, CE #2, CE #3, and CE #4 that are supplied to the third pad circuit receiving the chip enable signal CE, such that chip addressing can be performed by individual chip enable signals. That is, the first inner package chip is identified by a chip address signal composed of three bits corresponding to a ground voltage Vss, a ground voltage Vss, and a logic state of a first chip enable signal CE #1, and the eleventh inner package chip is identified by a chip address signal composed of three bits corresponding to a ground voltage Vss, a power-supply voltage Vdd, and a logic state of a third chip enable signal CE #3.

TABLE 2

| Chip | External | | | Internal | | |
|---|---|---|---|---|---|---|
| | CS_1 | CS_2 | CS_3 | CS_int_1 | CS_int_2 | CS_int_3 |
| Chip 1 | NC | NC | CE #1 | Vss | Vss | CE #1 |
| Chip 2 | Vdd | NC | CE #1 | Vdd | Vss | CE #1 |
| Chip 3 | NC | Vdd | CE #1 | Vss | Vdd | CE #1 |
| Chip 4 | Vdd | Vdd | CE #1 | Vdd | Vdd | CE #1 |
| Chip 5 | NC | NC | CE #2 | Vss | Vss | CE #2 |
| Chip 6 | Vdd | NC | CE #2 | Vdd | Vss | CE #2 |
| Chip 7 | NC | Vdd | CE #2 | Vss | Vdd | CE #2 |
| Chip 8 | Vdd | Vdd | CE #2 | Vdd | Vdd | CE #2 |
| Chip 9 | NC | NC | CE #3 | Vss | Vss | CE #3 |
| Chip 10 | Vdd | NC | CE #3 | Vdd | Vss | CE #3 |
| Chip 11 | NC | Vdd | CE #3 | Vss | Vdd | CE #3 |
| Chip 12 | Vdd | Vdd | CE #3 | Vdd | Vdd | CE #3 |
| Chip 13 | NC | NC | CE #4 | Vss | Vss | CE #4 |
| Chip 14 | Vdd | NC | CE #4 | Vdd | Vss | CE #4 |
| Chip 15 | NC | Vdd | CE #4 | Vss | Vdd | CE #4 |
| Chip 16 | Vdd | Vdd | CE #4 | Vdd | Vdd | CE #4 |

Therefore, the multi-chip package according to some embodiments of the present invention can provide a chip address signal in response to an external power-supply voltage, and can use the existing chip enable signal CE as a signal capable of identifying each inner package chip.

In addition, in accordance with some embodiments of the present invention, the input/output (IO) channel signal can be used as a chip address signal in the same manner as the chip enable signal CE is used. Provided that only the pad circuit configured to receive the above-mentioned signals IO and CE is prepared, it may be possible to perform chip packaging, irrespective of the position of leads in the package substrate capable of providing constant voltages such as Vcc, Vccq, Vssq, etc., using the control circuit capable of stabilizing/maintaining a voltage level at a predetermined logic state.

The pad circuit contained in the multi-chip package according to embodiments of the present invention can provide a chip address signal, and can also perform a function of selecting a specific option of the inner package chip to be packaged. For example, in order to select a specific mode during a data input/output (I/O) mode for an inner package chip, an activation signal or a deactivation signal may be provided separately. The multi-chip package according to an embodiment of the present invention populates/wires at least one inner package chip onto a package substrate, such that it can continuously provide an activation or deactivation signal through a specific lead. That is, a logic state of the lead connected to or non-connected to the pad circuit of the present invention can be continuously maintained. As a result, the specific mode can be physically established by the activation or deactivation signal, instead of by the chip address signal. In this case, operational stability can be more reliably guaranteed than if a separate signal is generated/provided, and selection of package use can be established during a fabrication process. In another embodiment, the inner package chip may receive a chip option signal instead of the chip address signal. The chip option signal designates a specific operation mode of the inner package chip such that the internal circuit included in the inner package chip determines the operation mode of the inner package chip.

In accordance with an embodiment of the present invention, the inner package chip may include a plurality of memory cells, each of which can store a plurality of bits. Each memory cell can operate as a multi-level cell MLC or a single-level cell SLC, and an operational mode of such memory cells can be selected and fixed during a packaging process. That is, instead of providing a separate signal for allowing each memory cell to operate as an MLC or SLC, characteristics of the memory cells can be determined through wiring when packaging the inner package chip including the memory cells.

Figure 6:
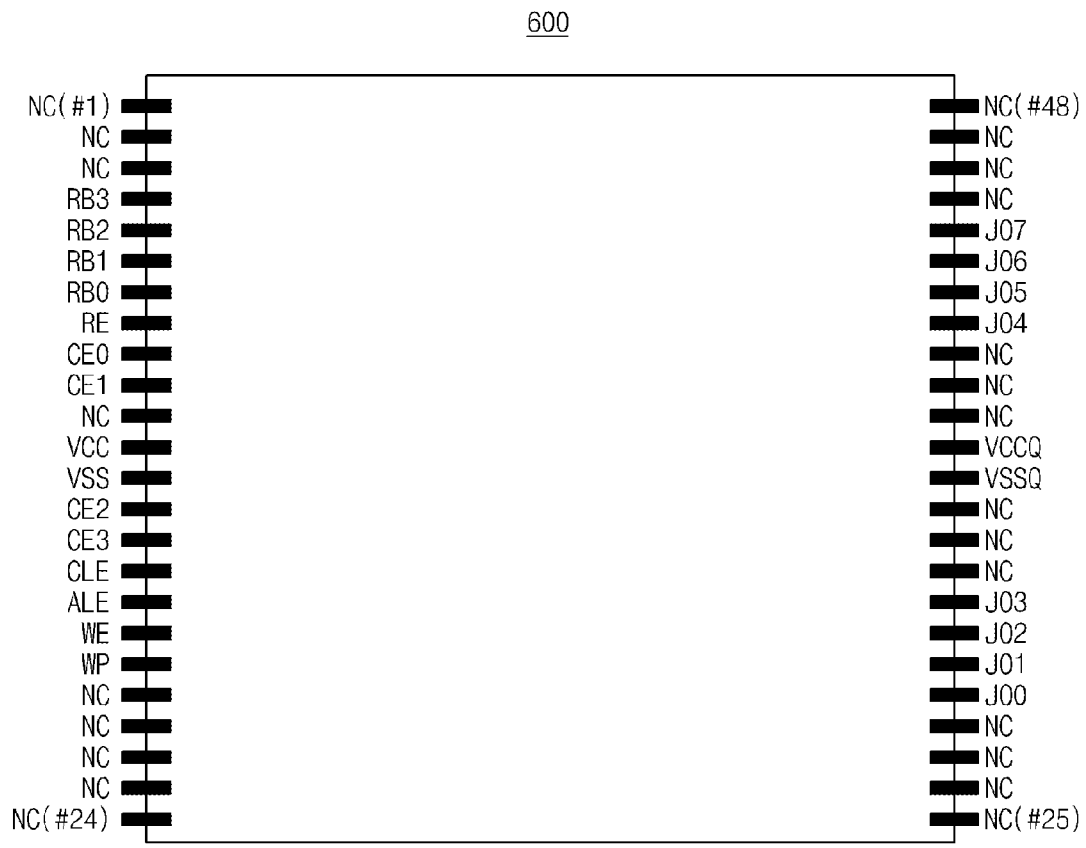
FIG. 6 illustrates a plan view of a multi-chip package according to an embodiment of the present invention.

FIG. 6 illustrates a plan view of a multi-chip package according to an embodiment of the present invention.

Referring to FIG. 6, the multi-chip package 600 includes a plurality of leads packaged onto a package substrate.

In the conventional multi-chip package, the position of inner package chips is limited with respect to leads for providing the power-supply voltage VCC or the ground voltage VSS. In the conventional multi-chip package, if each inner package chip is located far from the leads, the amount of a material requisite for wiring unavoidably increases. In addition, if each inner package chip uses an operational voltage having a voltage level different from that of the power-supply voltage VCC or the ground voltage VSS, the conventional multi-chip package must further include a constituent element such as a level shifter to perform chip addressing.

On the other hand, the multi-chip package 600 according to an embodiment of the present invention can address a plurality of inner package chips using a voltage received from a single lead, such that the position of the inner package chips is less limited on the package substrate. Although an inner package chip is not coupled to the lead, a voltage applied to selection pads of the inner package chip is maintained at a constant voltage level, so that it is possible to prevent a pad circuit of the inner package chip from being in a floating state.

As described above, the multi-chip package according to embodiments of the present invention provides a chip address signal according to connection or non-connection to the lead. Therefore, the multi-chip package can identify a plurality of inner package chips using the chip address signal and determine various operations of the inner package chips through connection to the lead. As a result, an operation of each inner package chip can be established during packaging. If operational characteristics of inner package chips are determined in the packaging process, a seller of the package can enable only some intended operations. In addition, a manufacturer of the package can physically determine the operational characteristics at a packaging step at the last step of manufacturing the inner package chip, such that various kinds of multi-chip packages can be stably and easily manufactured.

As is apparent from the above description, a multi-chip package according to embodiments of the present invention can use a single lead for providing a power-supply voltage without simultaneously using leads for providing a power-supply voltage and a ground voltage for chip addressing. Accordingly, the relationship between the multi-chip package and an external lead is not limited by lead arrangement and a plurality of inner package chips can be more freely arranged in the package.

The multi-chip package according to embodiments of the present invention prevents the occurrence of a floating state, which is generated when a ground voltage terminal is not coupled to a pad to maintain a chip address signal at a predetermined voltage level, such that power consumption is reduced and the accuracy of chip selection is increased.

The multi-chip package according to embodiments of the present invention can provide a selection signal capable of stably maintaining a predetermined value at each inner package chip through wiring of the packaging process, stably establish a selection condition for a chip having an operation selection condition, and guarantee security of a general user.

Those skilled in the art will appreciate that the present invention may be carried out in other specific ways than those set forth herein without departing from the spirit and essential characteristics of the present invention. The above exemplary embodiments are therefore to be construed in all aspects as illustrative and not restrictive. The scope of the invention should be determined by the appended claims and their legal equivalents, not by the above description, and all changes coming within the meaning and equivalency range of the appended claims are intended to be embraced therein. Also, it is obvious to those skilled in the art that claims that are not explicitly cited in each other in the appended claims may be presented in combination as an exemplary embodiment of the present invention or included as a new claim by a subsequent amendment after the application is filed.

Although a number of illustrative embodiments consistent with the invention have been described, it should be understood that numerous other modifications and embodiments can be devised by those skilled in the art that will fall within the spirit and scope of the principles of this disclosure. Particularly, numerous variations and modifications are possible in the component parts and/or arrangements which are within the scope of the disclosure, the drawings and the accompanying claims. In addition to variations and modifications in the component parts and/or arrangements, alternative uses will also be apparent to those skilled in the art.

What is claimed is:

1. A multi-chip package comprising:
   a single lead; and
   a plurality of inner package chips, wherein each of the plurality of inner package chips comprises:
  at least one pad circuit selectively coupled to the lead and configured to provide a chip address signal corresponding to a connection state to the lead; and
  an internal circuit configured to receive the chip address signal to identify a corresponding inner package chip.

2. The multi-chip package according to claim 1, wherein the pad circuit includes:
  at least one pad selectively coupled to the lead to receive an external power-supply voltage; and
  a control circuit electrically coupled to the pad and configured to stabilize a voltage of the pad to an addressing voltage so as to provide the chip address signal.

3. The multi-chip package according to claim 2, wherein:
  if the lead is coupled to the at least one pad, the control circuit is configured to cause the addressing voltage to correspond to a first logic state; and
  if the lead is not coupled to the at least one pad, the control circuit is configured to maintain the addressing voltage so that it corresponds to a second logic state.

4. The multi-chip package according to claim 3, wherein the first logic state corresponds to a logic state "HIGH", and the second logic state corresponds to a logic state "LOW".

5. The multi-chip package according to claim 3, wherein the control circuit includes:
  a logic element configured to perform a logic operation on a power on reset signal and a voltage of an address node selectively coupled to the lead;
  a PMOS transistor and a first NMOS transistor configured to operate in a complementary manner in response to a signal output from the logic element; and
  a second NMOS transistor including a gate terminal coupled to a first node between the PMOS transistor and the first NMOS transistor, and coupling the address node to a ground voltage terminal in response to a voltage of the first node.

6. The multi-chip package according to claim 5, wherein the control circuit further includes:
  an electrostatic discharge (ESD) circuit coupled to and disposed between the address node and the logic element and configured to prevent the voltage of the address node from suddenly increasing.

7. The multi-chip package according to claim 5, wherein:
  the PMOS transistor includes a first terminal receiving a power-supply voltage and a gate terminal coupled to an output terminal of the logic element; and
  the first NMOS transistor includes a first terminal coupled to the ground voltage terminal, a gate terminal coupled to the output terminal of the logic element, and a second terminal coupled to the first node.

8. The multi-chip package according to claim 7, wherein the control circuit further includes:
  a second NMOS transistor coupled to and disposed between a second terminal of the PMOS transistor and the first node and configured to compensate for a difference in driving ability between the PMOS transistor and the first NMOS transistor.

9. The multi-chip package according to claim 2, further comprising:
  a buffer configured to provide the chip address signal upon receiving the addressing voltage.

10. The multi-chip package according to claim 1, wherein the number of pad circuits included in each of the plurality of inner package chips is two or more, and the chip address signal includes bits corresponding to the number of the pad circuits.

11. The multi-chip package according to claim 1, wherein the lead is formed at a predetermined position of a package substrate.

12. The multi-chip package according to claim 11, wherein the package substrate includes a ball grid array (BGA), a small outline package (SOP), or a land grid array (LGA).

13. The multi-chip package according to claim 1, wherein the lead is electrically coupled to a pad circuit through wiring.

14. A multi-chip package comprising:
  a single lead; and
  a plurality of inner package chips,
  wherein each of the plurality of inner package chips comprises:
    at least one pad circuit selectively coupled to the lead and configured to provide a chip option signal corresponding to a connection state to the lead; and
    an internal circuit configured to determine an operation mode based on the chip option signal.

15. The multi-chip package according to claim 14, wherein the chip option signal maintains a logic state "HIGH" or a logic state "LOW" according to the connection state to the lead.

16. The multi-chip package according to claim 14, wherein the pad circuit is coupled to the lead through a bonding wire.

17. The multi-chip package according to claim 14, wherein the pad circuit includes:
  at least one pad selectively coupled to the lead to receive an external power-supply voltage; and
  a control circuit electrically coupled to the pad and configured to stabilize a voltage of the pad and provide the stabilized voltage as the chip option signal.

* * * * *